United States Patent
Bierhuizen (10) Patent No.: US 9,035,327 B2
(45) Date of Patent: May 19, 2015

(54) HYBRID COMBINATION OF SUBSTRATE AND CARRIER MOUNTED LIGHT EMITTING DEVICES (71) Applicant: KONINKLIJKE PHILIPS N.V, Eindhoven (NL)

(72) Inventor: Serge J. Bierhuizen, Santa Rosa, CA (US)

(73) Assignees: Koninklijke Philips Electronics N.V., Eindhoven (NL); Philips Lumileds Lighting Company, LLC, San Jose, CA (US)

(*) Notice: Subject to any disclaimer, the term of this patent is extended or adjusted under 35 U.S.C. 154(b) by 0 days.

(21) Appl. No.: 13/930,312

(22) Filed: Jun. 28, 2013

(65) Prior Publication Data
US 2014/0191254 A1    Jul. 10, 2014

Related U.S. Application Data (60) Division of application No. 12/909,004, filed on Oct. 21, 2010, now Pat. No. 8,486,761, which is a continuation-in-part of application No. 12/731,501, filed on Mar. 25, 2010, now Pat. No. 8,319,247.

(51) Int. Cl.
H01L 33/52      (2010.01)
H01L 31/12      (2006.01)
H01L 25/075     (2006.01)
H01L 33/54      (2010.01)
H01L 33/58      (2010.01)

(52) U.S. Cl.
CPC ............ *H01L 33/52* (2013.01); *H01L 25/0753* (2013.01); *H01L 33/54* (2013.01); *H01L 33/58* (2013.01); *H01L 2924/09701* (2013.01); *H01L 31/12* (2013.01); *H01L 2224/48091* (2013.01)

(58) Field of Classification Search
CPC ..... H01L 27/15; H01L 27/156; H01L 27/153; H01L 33/52
USPC ....................................................... 257/84, 88
See application file for complete search history.

(56) References Cited

U.S. PATENT DOCUMENTS

| 6,590,235 | B2 | 7/2003 | Carey et al. |
| 7,201,161 | B1 | 4/2007 | York |
| 7,321,161 | B2 | 1/2008 | Teixeira et al. |
| 7,352,011 | B2 | 4/2008 | Smits et al. |

(Continued)

FOREIGN PATENT DOCUMENTS

| JP | 2007116138 A | 5/2007 |
| JP | 2009536453 A | 10/2009 |

(Continued)

Primary Examiner — Long K Tran
Assistant Examiner — Jordan Klein (57) ABSTRACT

A multi-chip light emitting device (LED) uses a low-cost carrier structure that facilitates the use of substrates that are optimized to support the devices that require a substrate. Depending upon the type of LED elements used, some of the LED elements may be mounted on the carrier structure, rather than on the more expensive ceramic substrate. In like manner, other devices, such as sensors and control elements, may be mounted on the carrier structure as well. Because the carrier and substrate structures are formed independent of the encapsulation and other after-formation processes, these structures can be tested prior to encapsulation, thereby avoiding the cost of these processes being applied to inoperative structures.

13 Claims, 5 Drawing Sheets

(56) References Cited

U.S. PATENT DOCUMENTS

| | | | |
|---|---|---|---|
| 7,455,423 B2 * | 11/2008 | Takenaka | 362/231 |
| 7,538,359 B2 | 5/2009 | Eng et al. | |
| 7,700,964 B2 * | 4/2010 | Morimoto et al. | 257/98 |
| 7,855,389 B2 * | 12/2010 | Ishikura et al. | 257/79 |
| 8,558,259 B2 * | 10/2013 | Wirth | 257/95 |
| 8,696,159 B2 * | 4/2014 | Andrews et al. | 362/249.02 |
| 8,740,409 B2 * | 6/2014 | Nakata et al. | 362/249.02 |
| 2002/0088987 A1 | 7/2002 | Sakurai | |
| 2003/0020081 A1 | 1/2003 | Guida | |
| 2003/0168720 A1 | 9/2003 | Kamada | |
| 2003/0179548 A1 | 9/2003 | Becker et al. | |
| 2004/0169451 A1 * | 9/2004 | Oishi et al. | 313/45 |
| 2004/0217364 A1 * | 11/2004 | Tarsa et al. | 257/89 |
| 2005/0161771 A1 | 7/2005 | Suehiro | |
| 2005/0248259 A1 | 11/2005 | Chang | |
| 2006/0180824 A1 | 8/2006 | Kim | |
| 2006/0261364 A1 | 11/2006 | Suehiro | |
| 2007/0075306 A1 | 4/2007 | Hayashi et al. | |
| 2007/0223219 A1 * | 9/2007 | Medendorp et al. | 362/231 |
| 2007/0246726 A1 | 10/2007 | Lin | |
| 2007/0263384 A1 * | 11/2007 | Hsieh et al. | 362/231 |
| 2008/0001160 A1 | 1/2008 | Andrews | |
| 2008/0149960 A1 | 6/2008 | Amo | |
| 2008/0164484 A1 * | 7/2008 | Lee | 257/89 |
| 2008/0273340 A1 * | 11/2008 | Ng et al. | 362/373 |
| 2008/0290357 A1 * | 11/2008 | Lin et al. | 257/98 |
| 2008/0296751 A1 | 12/2008 | Fan | |
| 2009/0108281 A1 * | 4/2009 | Keller et al. | 257/98 |
| 2009/0116252 A1 | 5/2009 | Kille et al. | |
| 2009/0134409 A1 * | 5/2009 | Wang et al. | 257/89 |
| 2009/0154176 A1 * | 6/2009 | Matsuoka et al. | 362/382 |
| 2009/0230417 A1 | 9/2009 | Tsai | |
| 2009/0267093 A1 | 10/2009 | Kamada et al. | |
| 2009/0302340 A1 | 12/2009 | Ueji | |
| 2010/0025699 A1 * | 2/2010 | Liu et al. | 257/89 |
| 2010/0252851 A1 * | 10/2010 | Emerson et al. | 257/98 |
| 2011/0248616 A1 * | 10/2011 | Lai | 313/46 |
| 2011/0291129 A1 * | 12/2011 | Wirth | 257/89 |
| 2011/0316420 A1 * | 12/2011 | Chang et al. | 315/51 |

FOREIGN PATENT DOCUMENTS

| | | |
|---|---|---|
| WO | 2006095949 A1 | 9/2006 |
| WO | 2009067985 A1 | 6/2009 |
| WO | 2009106051 A2 | 9/2009 |

* cited by examiner

[Prior Art]

HYBRID COMBINATION OF SUBSTRATE AND CARRIER MOUNTED LIGHT EMITTING DEVICES

This application is a divisional of U.S. patent application Ser. No. 12/909,004 filed Oct. 21, 2010 which is a continuation-in-part of U.S. patent application Ser. No. 12/731,501, filed 25 Mar. 2010, the contents of which is incorporated by reference herein.

BACKGROUND

This invention relates to the field of Integrated Circuit (IC) fabrication and assembly, and in particular to the fabrication of an encapsulated multi-chip device, such as a multi-die LED with an integral encapsulation lens.

As the light emitting capabilities of solid state light emitting devices[1] (LEDs) continues to improve, their use in conventional lighting applications continues to increase, as does the competitive pressures to provide reliable, long-lasting products in a cost-effective manner. Even though the cost of LED products is relatively low, the savings of even a few cents per device can have a significant impact on profit margin, due to the increasingly growing market for these devices.

[1] For the purposes of this disclosure, the acronym 'LED' refers to a light emitting device; a light emitting diode being an example of such a light emitting device.

In the field of high-flux/lumen devices, multiple LEDs may be encapsulated in a single optical encapsulation material, such as a conventional dome-shaped epoxy lens. A common arrangement for producing white light is a combination of one or more yellow LEDs and one or more red LEDs. The yellow LEDs may be formed using InGaN as the emitting material, and the red LEDs may be formed using AlInGaP as the emitting material. The multiple LEDs are typically arranged on a common substrate, using, for example, Device on Ceramic (DoC) techniques, wherein the common substrate is a ceramic, such as aluminum nitrate (AlN) or alumina ($Al_2O_3$).

Figure 1A:
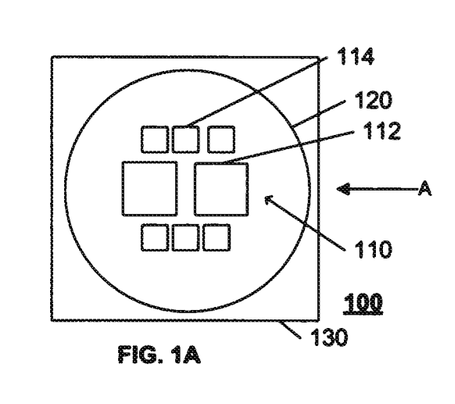
FIGS. 1A-1C illustrate a conventional multi-chip encapsulated device, and a conventional substrate tile.
Figure 1B:
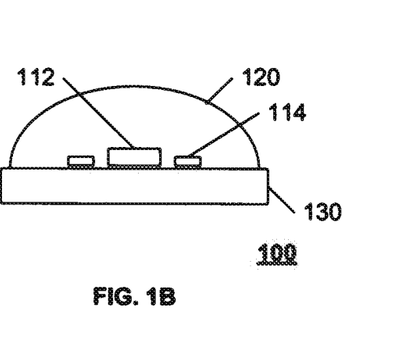

FIGS. 1A (top view) and 1B (side view) illustrate an example LED element 100 with a multi-chip LED combination 110 and a domed encapsulation 120. In this example, the LED combination 110 includes two yellow LED chips 112 (which may be formed, for example, by blue light emitters and phosphor wavelength converters) and six red LED chips 114. In order to provide appropriate optical characteristics for efficient light-extraction, the encapsulation 120 occupies a substantially larger surface area than the LED combination 110, and a correspondingly large substrate 130 may be needed to accommodate this encapsulation area.

The substrate 130 comprises a material that is sufficient to accommodate the processes involved in forming the LED dies, and preferably has appropriate thermal propagation characteristics to transfer the heat produced by the dies, thereby lengthening the operational life of the LED. As noted above, ceramic material, such as aluminum nitrate (AlN) or alumina (Al2O3), is commonly used, although other substances may also be used.

In a typical embodiment, the substrate material 130 may amount to at least 8-10 times the area of the LED arrangement 110. Additional area may also be required to provide the interconnections required to connect the structure 100 to the appropriate circuitry required to operate the LED array 110.

Figure 1C:
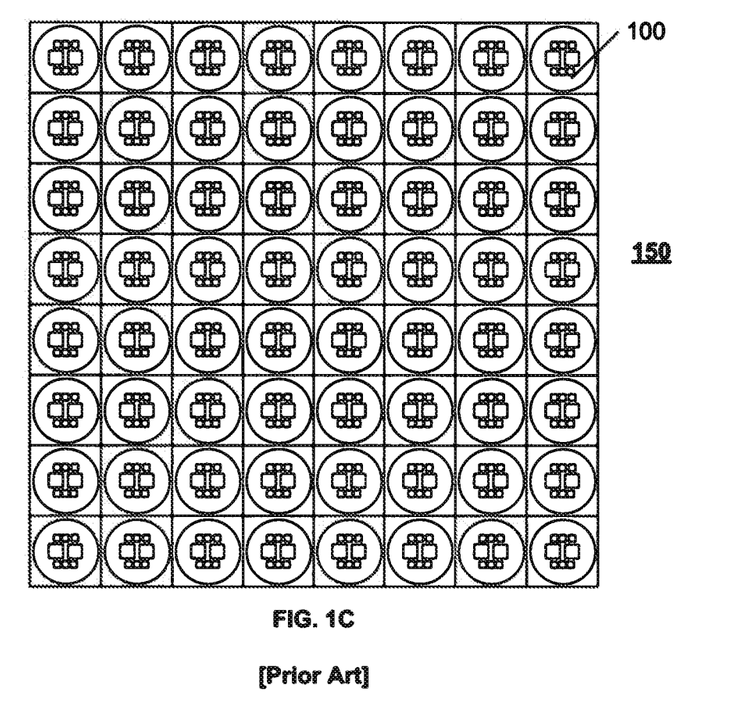

The conventional LED element 100 may be fabricated by forming a plurality of LED arrangements 110 on a single ceramic tile 150. For example, as illustrated in FIG. 1C, a typical 100 mm×100 mm ceramic tile may be used as a common substrate to form a 10×10 array of substrate elements 130 to provide a hundred LED elements 100. After fabrication, the 100 mm×100 mm ceramic tile may be sliced/diced to provide these hundred LED elements 100.

To minimize fabrication costs in the conventional processes, the encapsulation of the LED elements 100 may be performed while the structures are contained on the un-diced ceramic tile, so that all of the hundred LED elements 100 can be encapsulated in a single encapsulation process, using, for example, a single mold with corresponding 10×10 domed shapes. In like manner, if other manufacturing steps are required, such as the addition of phosphorescent material that provides light of a different wavelength than the wavelength(s) of the light generated by the LED combination 110, these steps may be performed while the LED elements 100 are on the un-diced ceramic tile.

The use of a larger ceramic tile would generally be preferred, to allow each processing step to be applied to more LED elements 100, thereby reducing manufacturing costs. For example, a 150 mm×150 mm tile will provide for the production of more than twice as many structures 100 than the conventional 100 mm×100 mm tile, while using the same processing steps with minimal additional costs. However, manufacturing limitations and quality control limitations do not currently allow for the use of tiles much larger than 100 mm×100 mm.

Because each of the aforementioned production steps may be performed with the fabricated LED arrays on the un-diced ceramic tile, both operative and inoperative LED arrangements 110 are fully processed, such that the cost of encapsulation and optional phosphorescent coating is incurred for each of the LED elements 100 on the tile 150, regardless of whether the encapsulated LED element 100 is operative or not.

To reduce manufacturing costs, the individual LED elements 100 on the tile 150 may be electrically connected to each other, to provide, for example, a single connection point for applying a common bias to facilitate etching, a common voltage to facilitate testing, and so on. When the tile is diced to create the finished LED elements 100, these connections between the elements 100 will be exposed on the edges of each element 100. Consumer safety groups, such as Underwriters Laboratory (UL) in the United States, may prohibit such exposed electrical connections when the LED element 100 is used in high voltage (110 v) applications, such as light bulbs. Even though the LED element 100 may be enclosed within a glass bulb, a possible breaking of the bulb should not allow any high voltage connections to be exposed. Because of this requirement, an additional protective layer may be applied to or over each LED element 100 after it is diced from the tile 150, to insulate any exposed connections, thereby increasing the manufacturing costs for such LED elements 100.

SUMMARY OF THE INVENTION

It would be advantageous to provide a lower cost multi-chip encapsulation product. It would also be advantageous to allow for interconnected elements on the undiced substrate tile while avoiding the additional application of a protective layer after the substrate is diced. It would also be advantageous to provide a multi-chip encapsulation product with higher reliability and/or longer operational life. It would also be advantageous to provide a multi-chip encapsulation product with a higher effective yield. It would also be advantageous to allow for the concurrent production of more devices per processing stage.

These advantages, and others, may be realized by a low-cost carrier structure that facilitates the encapsulation process while accommodating substrates that are optimized to support the devices that require a substrate. Depending upon the type of LED elements used, some of the LED elements may be mounted on the carrier structure, rather than on the more expensive ceramic substrate. In like manner, other devices, such as sensors and control elements, may be mounted on the carrier structure as well. Advantageously, the devices that are mounted on the carrier structure may be thermally separated from the substrate. Because the carrier and substrate structures are formed independent of the encapsulation and other after-formation processes, these structures can be tested prior to encapsulation, thereby avoiding the cost of these processes being applied to inoperative structures.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Also in the following description, commonly used materials and processes are referenced to facilitate better and/or easier understanding of the principles presented herein, although one of skill in the art will recognize that the principles of this invention are not limited to these references. For example, ceramic material is commonly used as a substrate, and epoxy is commonly used as an encapsulating material in a multi-chip encapsulated product, but the use of these terms herein is not intended to limit this invention to the use of ceramics, epoxy, multi-chips, and so on. In like manner, the initial example embodiments use the paradigm of a mix of different types of light emitting devices; however, as detailed further below, the invention is not limited to combinations of light emitting devices. Other devices, such as sensors, control elements, protection devices, rectifier circuitry, resistors and the like may be incorporated into the concepts taught in this specification.

With particular regard to references to multi-chip encapsulations, existing technology may limit the achievable size of viable integrated circuits, and thus multiple chips may be preferred in applications that require a relatively large semiconductor area. For example, the use of two yellow LED dies and six red LED dies in the example of FIG. 1 is currently more cost effective, and potentially more reliable, than a single yellow LED die and a single red LED die. Additionally, the use of multiple dies may provide more design flexibility than the use of a single die. However, one of skill in the art will recognize that the same principles that are presented herein for optimizing the production of current multi-chip designs will be applicable to single-chip designs of similar area.

In an operational environment, the LED element 100 of FIG. 1 may be mounted on a printed circuit board, metal core printed circuit board, or circuit layers that are printed upon a heat sink/heat spreader, each of which may have a different composition than the substrate 130, resulting in substantially different thermal expansion characteristics of these materials. For example, the printed circuit board may be an FR4 fiberglass board, and the substrate 130 may be an AlN ceramic tile. Because of the different thermal characteristics between the substrate 130 and the surface upon which it is mounted, changes in temperature will cause the connections (typically solder joints) between the substrate and the mounting surface to undergo stress, increasing the likelihood of failure. This may be particularly significant for devices that experience frequent thermal cycling, for example, as the device is turned on and off.

Of particular note, the stress caused by differences in thermal characteristics increases substantially as the distance between the connections is increased. Tests have demonstrated, for example, an approximate 50% reduction in the reliability of solder joints for a 2.1 mm length of a substrate, compared to a 1.5 mm length. To accommodate these thermal differences, Direct Bonded Copper (DBC) may be used to improve solder joint reliability, but the use of DBC increases the material and production costs for such devices. In like manner, the 'flatness' of the substrate must generally conform to the flatness surface of the element upon which it is mounted, increasing the cost of the substrate and/or the mounting element as the area of the substrate is increased.

Figure 2A:
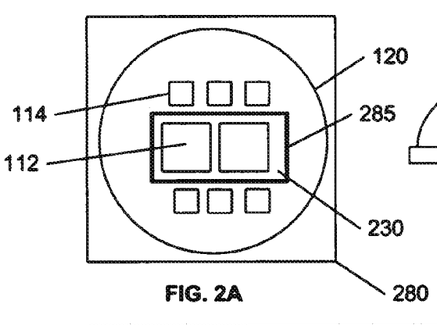
FIGS. 2A-2C illustrate an example multi-chip encapsulated device and a substrate tile in accordance with an aspect of this invention.
Figure 2B:
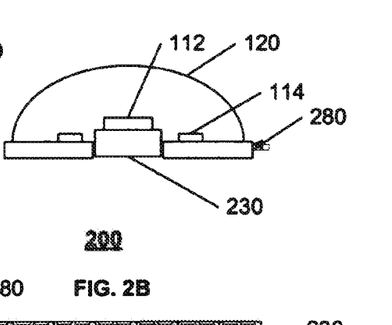

FIGS. 2A-2B illustrate an example multi-chip encapsulated device 200 in accordance with this invention. In this example, only the example LED dies 112 are mounted on the substrate 230; the example LED dies 114 are mounted on a carrier 280. The carrier 280 includes a cavity or receptacle 285 within which the substrate 230 may be situated. In this manner, the carrier 280 provides the additional area that may be required for the encapsulation 120 that may be molded over the LEDs 112, 114. Of particular note, the substrate 230 is significantly smaller in area than the substrate 130 of the conventional device 100 of FIG. 1. For the purposes of this disclosure, the term substrate is used in the general sense, and may include any element or elements that provide at least some structural support to the LED(s) 112, including the functional elements or layers used to form the light emitting device, such as Chip Scale Package (CSP) LED structures made using wafer level processing.

Figure 2C:
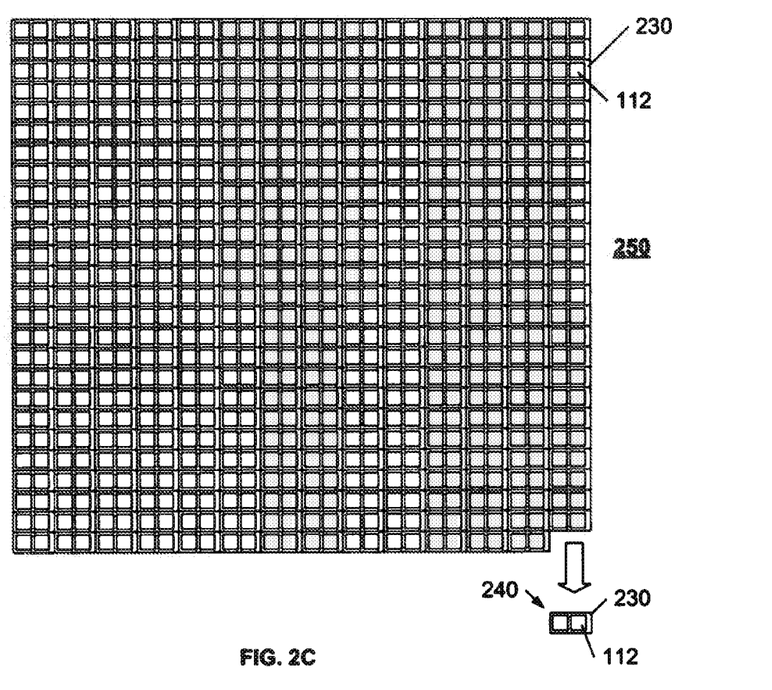

As is known in the art, InGaN LED chips may require the use of a ceramic, or similar, substrate, whereas AlInGaP LED chips may be mounted on a less expensive substrate, including, for example, common sheet metal or fiberglass. By mounting the AlInGaP LED chip on the less expensive substrate, herein termed a carrier to distinguish it from the ceramic substrate, the size of the ceramic substrate 230 may be reduced to support only the InGaN LED chips. As illustrated in FIG. 2C, a ceramic tile 250 of the same size as the tile 150 of FIG. 1C can accommodate a substantially larger number of substrate elements 230 than substrate elements 130. In this example, the tile 250 accommodates 364 (14×26) substrate elements 230, compared to the 100 (10×10) substrate elements 130 on tile 150.

One of the functions of the substrate 230 may be to transfer and/or dissipate the heat that is generated by the LED chips 112. Using current LED technologies, the substrate 230 may be approximately 2 mm larger in each dimension than the area of the LED chips 112 to satisfy this heat transfer/dissipation requirement. One of skill in the art will recognize, however, that the size of the substrate 230 may be larger or smaller, depending upon the amount of heat to be dissipated, the thermal characteristics of the substrate 230, and the type of heat sink, if any, that the substrate 230 may be coupled to. As detailed further below, 'wafer scale' processing may be used to provide 'chip scale packaging', wherein the substrate is only slightly larger than the LED array.

The use of a carrier 280 that is separate from the substrate 230 may also provide thermal separation or differentiation between the chips 112 and 114. This thermal separation may improve the efficiency and/or reliability of the device by reducing the temperature to which the chips 114 may be subjected. For example, the light output of AlInGaP has been determined to degrade by about 50% when the junction temperature of the AlInGaP emitter is increased by 100° C. This change in red flux causes changes toward a warm white colorpoint of the combination of AlInGaP and InGaN plus yellow phosphor. When AlInGaP and InGaN emitters are mounted on the same substrate, as in FIG. 1, the high operating temperature of the InGaN emitters causes the operating temperature of the AlInGaP emitters to increase. By the choice of coupling techniques between the substrate 230 and the carrier 280, and/or the choice of materials used for the carrier 280, the AlInGaP devices may be given a better thermal environment for improved efficiency.

After the LED chips 112 are formed on the tile 250, and optionally covered with a phosphor coating, the tile 250 may be diced to form individual LED elements 240, comprising one or more LED chips 112 and a substrate element 230.

Figure 3:
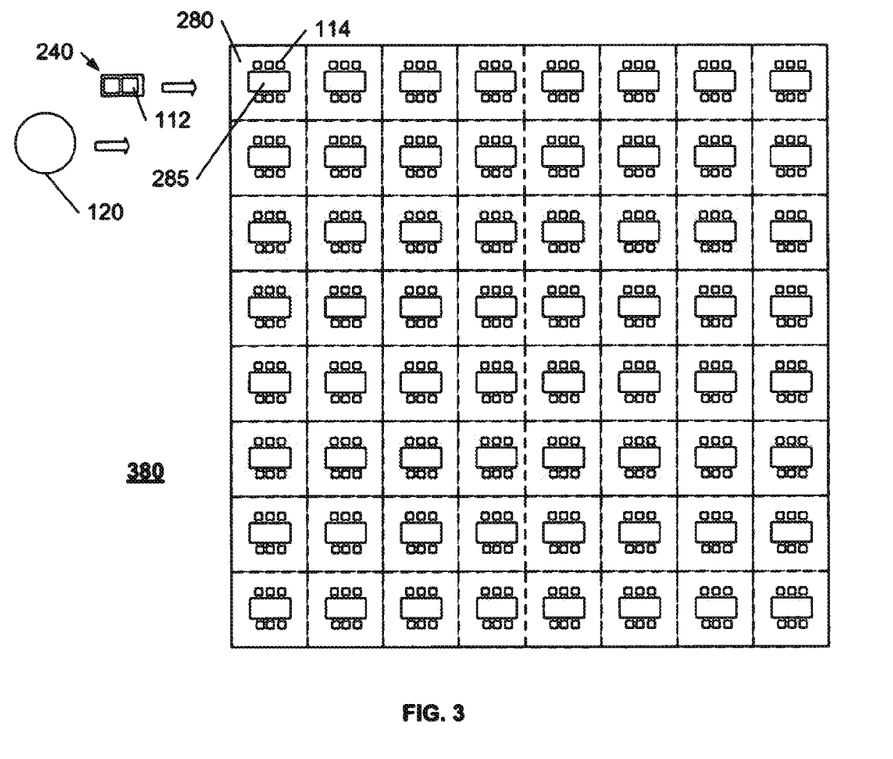
FIG. 3 illustrates an example carrier frame in accordance with an aspect of this invention.

FIG. 3 illustrates a frame 380 from which the individual carriers 280 may be produced. This frame 380 may be an inexpensive material, such as sheet metal, lead frame, FR4 board, FR4, LTCC, HTCC, etc with cutouts or cavities 285 for receiving the individual LED elements 240.

As noted above, the LED elements 114 that do not require a ceramic substrate may be mounted on the frame 380. The frame 380 may also include circuit traces that facilitate the connection of the LED chips 114 on the frame and the LED chips 112 on the substrate 230 to external sources of power. These traces may be configured in any manner, depending upon the particular structure of the LED chips 112, 114 and the requirements for external connections. Bonded connections to the frame 380 may also serve as mechanical connections to support the LED element 240 in the frame. A variety of interconnection schemes are detailed in the parent application to this application, U.S. patent application Ser. No. 12/731,501, "CARRIER FOR A LIGHT EMITTING DEVICE", filed 25 Mar. 2010 for Serge Bierhuizen, the contents of which are incorporated by reference herein. Other connection schemes are detailed further below.

A tape or film applied to the underside of the frame 380 may facilitate a temporary and/or permanent attachment of the LED elements 240 to the frame 380 until the completed encapsulated devices 200 are formed and diced. If overmolding is used for encapsulating the LED elements 240, this tape or film may also provide the vacuum seal required for the overmolding processes.

The LED elements 240 may be pretested before they are inserted into the frame 380, typically via a conventional pick-and-place process. In like manner, the LED chips 114 on each carrier 280 of the frame 380 may be pretested. By placing only functional LED elements 240 into carriers 280 with functional LED chips 114, yield is improved, and the cost of assembly and encapsulation 120 may be avoided for non-functional LED elements 240 or non-functional carriers 280.

Although the frame 380 is illustrated in FIG. 3 as being the same relative size as the conventional tile 150 that may be used to provide the multi-chip array structures 100 of FIGS. 1A-1C and FIGS. 2A-2C, for ease of understanding, the frame 380 of this invention does not need to conform to the requirements of a ceramic substrate, or other substrate that may be used to support the LED chips 112, because the substrate elements 230 are sufficient to accommodate these requirements. Accordingly, the frame 380 may be sized to support a substantially larger number of carriers 280, and may have better matching thermal characteristics (e.g. Thermal Expansion Coefficient) relative to the surface to which it is attached, such as a printed circuit board. That is, for example, instead of a tile 150 that accommodates a 10×10 array of LED elements 140 as illustrated in FIG. 1, the frame 380 could be sized to accommodate a 20×20 array of carriers 280, thereby quadrupling the number of LED elements that can be processed during each subsequent manufacturing operation.

Also, even if the frame 380 does not inherently have thermal characteristics that are somewhat matched to the printed circuit board or other surface upon which it is eventually installed, the fact that the substrate 230 and carrier 280 are discrete elements that are joined together further reduces the stress. The smaller size of the substrate element 230 may also reduce the 'flatness' requirements for the substrate 230 and the printed circuit board, or other mounting surface to which the LED element 240 is attached.

After the LED elements 240 and LED chips 114 are placed in the frame, and electrical connections as required are made, the finished structures may be encapsulated, using any of a variety of encapsulation processes, depending upon the optical and mechanical requirements for the devices 200. A mold for forming the encapsulation elements 120 of the appropriate optical qualities may be created to fit the frame 380, so that the encapsulation can be accomplished in a single processing step. As noted above, since the frame 380 may be substantially larger than the conventional ceramic tile 150, a significantly larger number of devices 200 can be encapsulated in the single encapsulation step, thereby further reducing the cost per completed device 200.

Figure 4A:
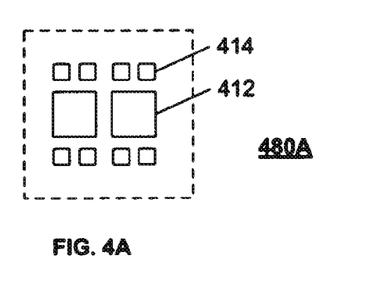
FIGS. 4A-4B illustrate example carrier templates.
Figure 4B:
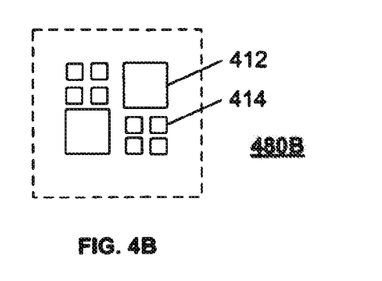

FIGS. 4A-4B illustrate example carrier template designs 480A, 480B. In these examples, the completed device will have two LEDs 412 of a first type mounted on a ceramic, or similar, substrate, and eight LEDs 414 of a second type mounted on the carrier 480A, 480B. As contrast to the example device 200, each of the two LEDs 412 is mounted on an individual substrate, and two receptacle regions for these substrates are provided in the carrier 480A, 480B. In an embodiment, the receptacle regions may be holes in the carrier, although other structures, such as wells or recesses are also feasible. One of skill in the art will recognize that the number of LEDs of each particular type may be dependent upon the desired light output color and intensity, and the arrangement of these LEDs on the carrier may be dependent upon achieving a balanced mix of the colors from the LEDs.

Figure 5A:
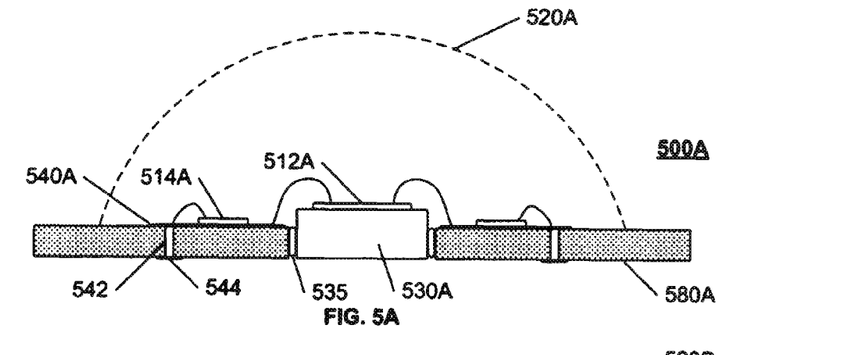
FIGS. 5A-5C illustrate example embodiments of hybrid substrate and carrier mounted light emitting devices.
Figure 5B:
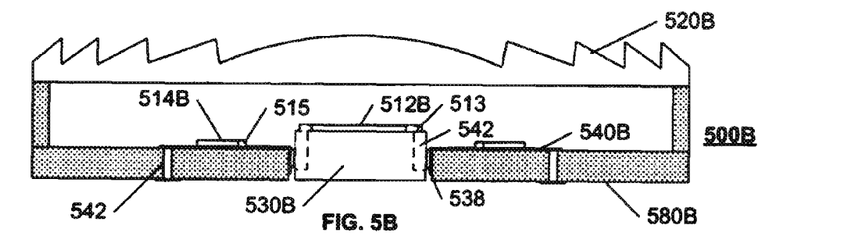
Figure 5C:
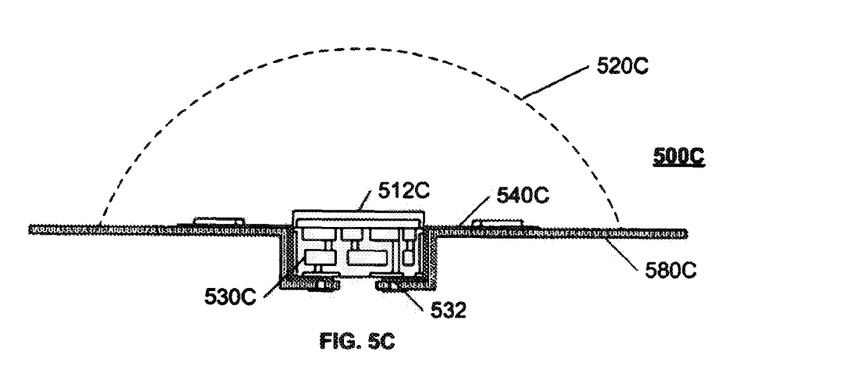

FIGS. 5A-5C illustrate example embodiments of hybrid substrate and carrier mounted light emitting devices.

In the example embodiment of FIG. 5A, the LEDs 512A and 514A are wire bonded to circuit traces 540A on the carrier 580A. These circuit traces may be coupled to vias 542 that provide coupling to connection pads 544 beneath the carrier 580. A thermal transfer material 535 may be used to couple the ceramic substrate 530A to the carrier 580A, to facilitate the transfer of heat from the substrate 530A. Alternatively or in addition, the traces on the customer board that part 500A may be soldered to can conduct and spread or bridge heat from the ceramic substrate 530A to the carrier 580A, which will increase additional heat spreading.

After wire-bonding the LEDs 512A and 514A, the entire structure 500A may be encapsulated by an encapsulant 520A, typically in a form that provides the desired optical characteristics of the finished structure 500A. For example, in addition to providing a lens function, the encapsulant 520A may be a silicone material with $TiO_2$ particles, the $TiO2$ particles serving to provide a white appearance when the LED is turned off, as well as enhancing the adhesion of the silicone to the encapsulated elements.

Because the entirety of the substrate 530A may be within the encapsulant 520A, any exposed contacts on the substrate 530A, except those on the bottom of the substrate, are not exposed after the encapsulant 520A is applied. In this manner, the finished structure 500A will conform to the safety regulations that prohibit such exposed contacts.

In the example of FIG. 5B, the LEDs 512B and 514B may include internal circuitry 513, 515 that allows the devices to be coupled to traces 540B. In this example, the substrate 530B may also includes internal circuitry 542 that allows the LED 512B to be coupled to the traces 540B, via conductive material 538. A silver epoxy or other conductive material such as anisotropic conductive adhesives may be used, thereby serving to also attach the substrate 530B to the carrier 580B. Alternatively, the circuitry 542 may be extended to beneath the substrate 530B, avoiding the need to couple the LED 512B to the traces 540B, and providing independent connections to the LED(s) 512B and the LED(s) 514B.

A preformed lens structure 520B may be situated above the LEDs 512B and 514B, to allow the device 500B to have a lower profile while still providing a wide dispersion of the emitted light. As in device 500A, because the lens structure 520B completely encompasses the substrate 530B, any exposed contacts on the substrate 530B, other than those below the substrate 530B, are no longer exposed when the lens structure 520B is applied.

The substrate 530C may be multilayered, as illustrated in the example of FIG. 5C, and may provide contacts 532 to the LED 512C beneath the substrate 530C. The carrier 580C may be shaped to support the substrate 530C, and the circuit traces 540C may extend to the contacts 532 at the base of the LED 512C.

As in devices 500A and 500B, because the lens structure 520C may completely encompass the substrate 530C, any exposed contacts on the substrate 530C, other than those in the exposed area below the substrate 530B, are no longer exposed when the lens structure 520B is applied.

Although the invention has been presented thus far in the context of LEDs, one of skill in the art will recognize that the elements 114 on the carrier 380 are not limited to light emitting devices. The other elements may include, for example, sensors that provide feedback, control elements, communication elements for feedback and/or control, and others. Example elements may include a TSV diode for ESD protection, a thermistor that provides thermal feedback, optical sensors for color balancing and/or flux feedback, motion or light sensors for on/off control, wireless receivers that receive remote commands, rectifier circuitry, resistors drive and so on. The elements may also include elements that are typically used to operate the lamp, such as an AC-DC converter to drive the light emitting element(s). Virtually any type of element may be placed on the carrier, size permitting. Additionally, all of the elements on the carrier 380 need not be situated below the lens 120.

Figure 6:
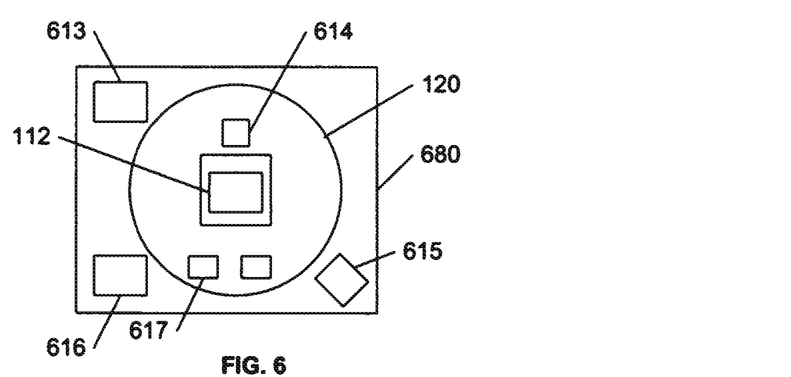
FIG. 6 illustrates an example embodiment of a hybrid carrier with multiple devices.

FIG. 6 illustrates an example configuration with elements situated inside and outside the lens 120. Element 613 may be, for example, a motion sensor that is placed outside the lens 120 to obtain an unobstructed field of view of the area being monitored. Element 614 may be another sensor that is placed within the lens 120 to take advantage of the optical characteristics of the lens 120. Element 615 may be a sensor placed outside the lens 120 with a field of view back toward the lens 120, for sensing the flux or color being emitted. Element 616 may be an element whose size precludes its placement within the lens. Element 617 may be an element that needs to be within the lens 120, but is situated at a distance from the light emitting element 112 to minimize thermal coupling.

The carrier 680 may also be configured as an electrical element. For example, surfaces on the carrier 680 may be plated to form capacitors; circuit traces may be arranged in coil-like patterns to form inductors or transformers; and so on.

Figure 7:
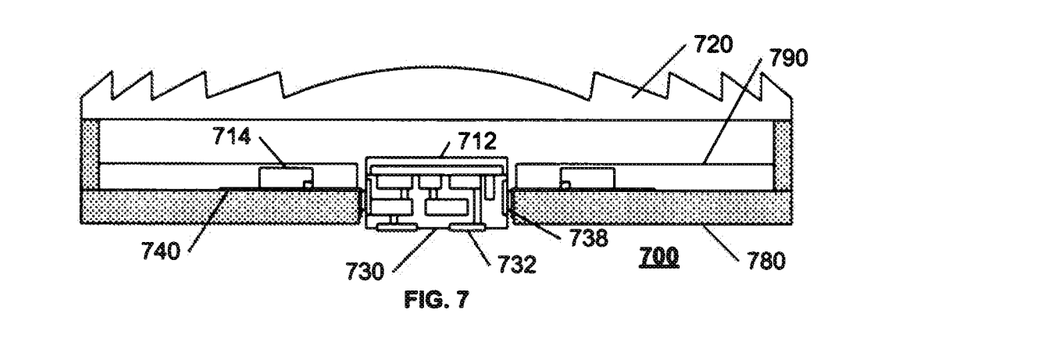
FIG. 7 illustrates another example embodiment of a hybrid carrier and substrate.

FIG. 7 illustrates another example embodiment, wherein contact to external circuits may be provided via contacts 732 on the lower surface of the substrate 730. In this example embodiment, coupling to the devices 714 is provided via contacts 738 between the carrier 780 and the substrate 730. In this manner, through-holes in the carrier 780 may be avoided.

Also illustrated in FIG. 7, a layer of reflective material 790 may be applied over the devices 714, to redirect light that is reflected from the lens 720 or elsewhere. Material 790 may be any reflective material. For example, in copending U.S. patent application 61/392,378, "HIGHLY REFLECTIVE COATING ON LED SUBMOUNT", filed 12 Oct. 2010 for Brendan Moran, Frederic S. Diana, Serge L. Rudaz, Li Zhang, Jeff Kmetec, and Iain Black, and incorporated by reference herein, discloses that a dielectric, ceramic, or semiconductor material, such as TiO2, Al2O3, Y2O3, ZrO2, $SiO_2$, AlN, AlON, GGG, PLZT, PZT, SiAlON, SiC, SiON, YAG, BaTiO3, SrTiO3, diamond, ZnSe, ZnS, ZnTe, BaSo3, cubic zirconium, etc., will generally be suitable, as well as a sol gel of one or more of these compounds, wherein the compound is contained in a host silicate network. In like manner, a particle loaded resin, such as a silicone or epoxy resin with particles of the materials listed above, would also be suitable. Generally, a reflective material can be made by providing a high index contrast between a particle and the host matrix. Similarly, a single material with a high degree of porosity will be reflective, because air has a high index contrast with most solids. The reflective material 790 may cover the devices 714, or may be patterned to allow light from light emitting devices 714 to exit. The application of the reflective material 790 may be performed before the device 712 is attached to the carrier 780, which may eliminate the need to pattern the reflective material 790 to avoid covering the device 712. Alternatively, the aforementioned silicone material with $TiO_2$ particles may serve as the reflective material, and applied after the device 712 is situated within the carrier 780; in this manner, the reflective material may serve to adhere the device 712 to the carrier 780.

The foregoing merely illustrates the principles of the invention. It will thus be appreciated that those skilled in the art will be able to devise various arrangements which, although not explicitly described or shown herein, embody the principles of the invention and are thus within its spirit and scope. For example, if different wavelength conversion elements are desired for the LEDs on the substrate and the LEDs on the carrier, the appropriate wavelength conversion elements may be applied to the LEDs on the substrate, or the LEDs on the carrier, or both, before the substrate is introduced into the carrier. In like manner, if any step of the manufacturing process is unsuitable for either the devices on the frame or the devices on the substrate, these steps may be performed before the substrate is introduced into the carrier. In like manner, although the invention has been presented in the context of a substrate mounted device of a particular type forming the substrate that is situated in a carrier with other elements, the carrier may also be configured to accommodate a variety of types of substrate elements. For example, light emitting elements of one type (e.g. InGaN) may be mounted on a substrate of a suitable type (e.g. Alumina), while a light emitting element of a second type (e.g. AlInGaP) may be mounted on a substrate of a different type (e.g. High Temperature Cofired Ceramic (HTCC), which is less costly than Alumina, particularly if the substrate includes interconnections), and the carrier is configured to accommodate both of these substrates as well as accommodating other elements situated on the carrier. These and other system configuration and optimization features will be evident to one of ordinary skill in the art in view of this disclosure, and are included within the scope of the following claims.

In interpreting these claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) each of the disclosed elements may be comprised of hardware portions (e.g., including discrete and integrated electronic circuitry), software portions (e.g., computer programming), and any combination thereof;

f) hardware portions may include a processor, and software portions may be stored on a non-transient computer-readable medium, and may be configured to cause the processor to perform some or all of the functions of one or more of the disclosed elements;

g) hardware portions may be comprised of one or both of analog and digital portions;

h) any of the disclosed devices or portions thereof may be combined together or separated into further portions unless specifically stated otherwise;

i) no specific sequence of acts is intended to be required unless specifically indicated; and j) the term "plurality of" an element includes two or more of the claimed element, and does not imply any particular range of number of elements; that is, a plurality of elements can be as few as two elements, and can include an immeasurable number of elements.

I claim:

1. A device comprising:
a substrate upon which one or more first light emitting elements are located;
a carrier upon which one or more second elements are located, wherein the substrate is situated within a receptacle in the carrier;
an encapsulant that encapsulates at least the first light emitting element and at least a portion of the carrier beyond the first light emitting element;
wherein at least one of the one or more second elements includes a second light emitting element.

2. The device of claim 1, including a wavelength conversion element situated above one or more of the first and second light emitting elements.

3. The device of claim 1, wherein at least one of the one or more first light emitting elements includes InGaN material and the second light emitting element includes AlInGaP material.

4. The device of claim 1, wherein the encapsulant encapsulates an entirety of a surface of the substrate.

5. The device of claim 1, wherein the first light emitting element is coupled to the carrier via one or more contact at one or more edges of the light emitting element.

6. The device of claim 1, wherein the first light emitting element includes one or more contacts at a base of the light emitting element.

7. The device of claim 1, wherein the second elements are located on a first surface of the carrier, and the carrier includes vias that facilitate connections to the device on a second surface of the carrier.

8. The device of claim 1, wherein the receptacle is a hole in the carrier.

9. The device of claim 1, wherein the receptacle is a recess in the carrier.

10. The device of claim 1, wherein the receptacle is a first receptacle and the substrate is a first substrate, the device further comprising a second substrate upon which a third element is located, wherein the second substrate is situated within a second receptacle in the carrier.

11. The device of claim 1, wherein the substrate is ceramic and the carrier is one of sheet metal, lead frame, fiberglass, and circuit board.

12. A device comprising:
a substrate upon which one or more first light emitting elements are located;
a carrier upon which one or more second elements are located, wherein the substrate is situated within a receptacle in the carrier;
an encapsulant that encapsulates at least the first light emitting element and at least a portion of the carrier beyond the first light emitting element; and
wherein at least one of the one or more second elements includes at least one of: a resistor, a capacitor, a rectifier, and one or more elements of an AC-DC converter.

13. A device comprising:
a substrate upon which one or more first light emitting elements are located;
a carrier upon which one or more second elements are located, wherein the substrate is situated within a receptacle in the carrier;
an encapsulant that encapsulates at least the first light emitting element and at least a portion of the carrier beyond the first light emitting element; and
wherein at least one of the one or more second elements includes a sensor.

* * * * *